(12) United States Patent
Shih et al.

(10) Patent No.: US 6,638,868 B1
(45) Date of Patent: Oct. 28, 2003

(54) METHOD FOR PREVENTING OR REDUCING ANODIC CU CORROSION DURING CMP

(75) Inventors: Tsu Shih, Hsin-Chu (TW); Kun Ku Hung, Changhua (TW); Wen-Hun Tung, Taichung (TW); Wen-Chin Chiou, Maioli (TW)

(73) Assignee: Taiwan Semiconductor Manufacturing Co. Ltd., Hsin Chu (TW)

( * ) Notice: Subject to any disclaimer, the term of this patent is extended or adjusted under 35 U.S.C. 154(b) by 0 days.

(21) Appl. No.: 10/141,221

(22) Filed: May 7, 2002

(51) Int. Cl.[7] .................. H01L 21/302; H01L 29/76; C23F 1/02
(52) U.S. Cl. ............... 438/692; 438/687; 156/345.55; 257/330; 257/332
(58) Field of Search .............. 156/345.55; 257/330, 257/332; 438/270, 271

(56) References Cited

U.S. PATENT DOCUMENTS

| | | | | |
|---|---|---|---|---|
| 5,081,421 A | * | 1/1992 | Miller et al. | |
| 5,337,015 A | * | 8/1994 | Lustig et al. | |
| 6,169,024 B1 | * | 1/2001 | Hussein | |

* cited by examiner

Primary Examiner—John F. Niebling
Assistant Examiner—Stanetta Isaac
(74) Attorney, Agent, or Firm—Tung & Associates

(57) ABSTRACT

A method and apparatus for implementing the method for preventing or reducing corrosion of copper containing features included in a semiconductor wafer in a chemical mechanical polishing (CMP) process the method providing at least one semiconductor wafer polishing surface including copper filled anisotropically etched features; polishing the at least one semiconductor wafer polishing surface according to a CMP process having a polishing pad surface contacting the at least one it semiconductor wafer polishing surface at least a portion of the polishing pad in electrically conductive communication with a conductive polishing platen; and, providing at least one electrically conductive pathway from the conductive polishing platen.

14 Claims, 2 Drawing Sheets

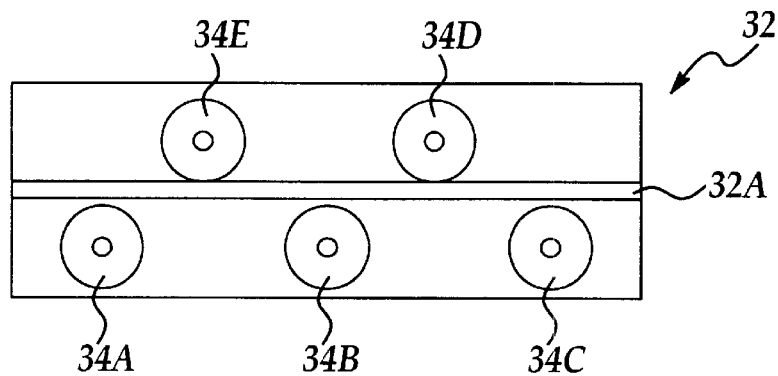
_Figure 2C_
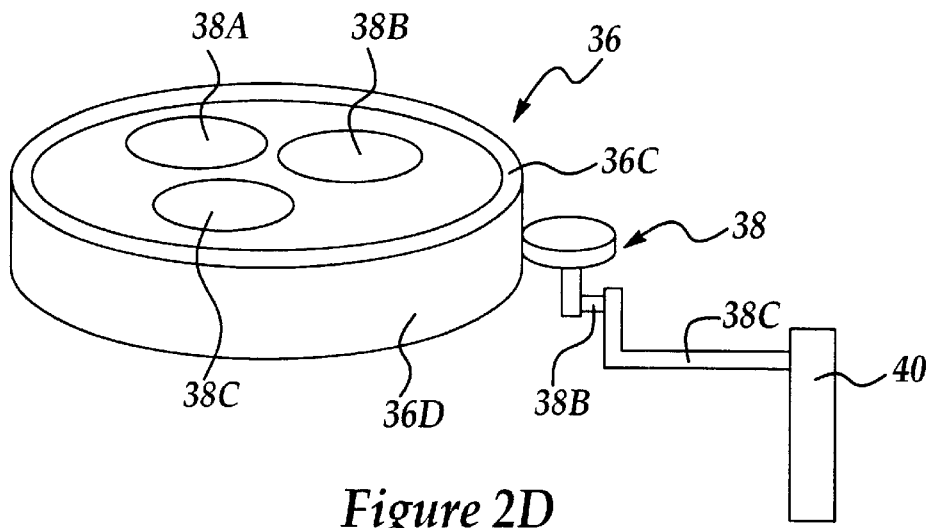
_Figure 2D_
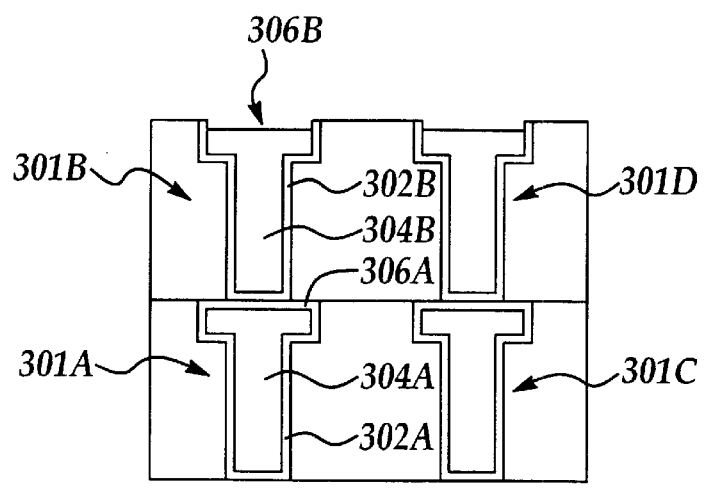
_Figure 3_

METHOD FOR PREVENTING OR REDUCING ANODIC CU CORROSION DURING CMP

FIELD OF THE INVENTION

This invention generally relates to chemical mechanical polishing (CMP) and more particularly to a method for preventing or reducing anodic copper (Cu) corrosion in a chemical mechanical polishing (CMP) process.

BACKGROUND OF THE INVENTION

In semiconductor fabrication integrated circuits sand semiconducting devices are formed by sequentially forming features in sequential layers of material in a bottom-up manufacturing method. The manufacturing process utilizes a wide variety of deposition techniques to form the various layered features including various etching techniques such as anisotropic plasma etching to form device feature openings followed by deposition techniques to fill the device features. In order to form reliable devices, close tolerances are required in forming features including photolithographic patterning methods which rely heavily on layer planarization techniques to maintain a proper depth of focus.

Planarization is increasingly important in semiconductor manufacturing techniques. As device sizes decrease, the importance of achieving high resolution features through photolithographic processes correspondingly increases thereby placing more severe constraints on the degree of planarity required of a semiconductor wafer processing surface. Excessive degrees of surface nonplanarity will undesirably affect the quality of several semiconductor manufacturing process including, for example, in a photolithographic process, the positioning the image plane of the process surface within an increasingly limited depth of focus window to achieve high resolution semiconductor feature patterns.

In the formation of conductive interconnections, copper is increasingly used for forming metal interconnects such as vias and trench lines since copper has low resistivity. The undesirable contribution to electrical parasitic effects by metal interconnect residual resistivity has become increasingly important as device sizes have decreased.

One planarization process is chemical mechanical polishing (CMP). CMP is increasingly being used as a planarizing process for semiconductor device layers, especially for applications with smaller semiconductor fabrication processes, for example, below about 0.25 micron. CMP planarization is typically used several different times in the manufacture of a multi-layer semiconductor device, including planarizing a layered device structure in a multi-layer device for subsequent processing of overlying layers. For example, CMP is used to remove excess metal after filling conductive metal interconnects such as vias and trench lines with metal, for example copper, to electrically interconnect the several layers and areas that make up a multi-layer semiconductor device.

In a typical process for forming conductive interconnections in a multi-layer semiconductor device, a damascene process is used to form vias and trench lines for interconnecting different layers and areas of the multilayer device. Vias (e.g., V1, V2 etc. lines) are generally used for vertically electrically interconnecting semiconductor device layers and trench lines (e.g., M1, M2, etc. lines) are used for electrically interconnecting semiconductor device areas within a layer. Vias and trench lines are typically formed as part of a damascene process. Although there are several different methods for forming damascene structures, one typical method generally involves patterning and anisotropically etching a semiconductor feature, for example a via opening within an insulating dielectric layer to make closed communication contact with a conductive area within an underlying layer of the multilayer device. A similar process is then used to pattern and anisotropically etch a trench line opening overlying and encompassing the via opening to form a dual damascene structure. The dual damascene structure is then filled with a metal, for example copper followed by a CMP step to remove excess metal overlying the insulating layer dielectric (ILD) surface and to planarized the ILD surface for a subsequent processing step. The process is then repeated in an overlying ILD layer to form a series of stacked conductive lines which electrically communicate between and within the various layers to form a multi-layered semiconductor device. Typically, vias and dual damascene structures are stacked above one another to reduce an overall space requirement for patterning a semiconductor device.

CMP generally includes placing a process surface of the wafer in contact against a flat polishing surface, imparting a downforce to the wafer backside and moving the wafer and the polishing surface relative to one another. The polishing action is typically aided by a slurry which includes for example, small abrasive particles such as silica ($SiO_2$) or alumina ($Al_2O_3$) that abrasively act to remove a portion of the process surface. Additionally, the slurry may include chemicals such as complexing agents and film forming agents that react with the process surface to assist in removing a portion of the surface material, the slurry typically being introduced to contact the wafer surface and the polishing pad.

Typically CMP polishing slurries contain an abrasive material, such as silica or alumina, suspended in an aqueous medium. There are various mechanisms disclosed in the prior art by which metal surfaces can be polished with slurries. In one method, the formation of a thin oxide layer takes place in-situ by reaction between the metal surface and an oxidizing agent which simultaneously forms an oxide layer while an abrasive is removing the oxide layer. The thin abradable oxide layer including the underlying metal layer is thereby selectively removed in a controlled manner by mechanical abrasive action. The rate of material removal can be varied by adjusting the rate of oxide formation and material removal.

Several semiconductor feature defects can be associated with CMP polishing. For example, in CMP polishing metals, for example copper features included in an array of metal interconnects, the copper is removed or eroded at a faster rate than the surrounding field of insulating dielectric. This causes a topography difference between insulating dielectric and the dense copper array, typically referred to as erosion or corrosion. Such erosion (corrosion) can lead to excess removal of copper such that overlying formation of electrical interconnecting features, for example, stacked vias, leads to electrical failure by causing discontinuous electrical communication pathways.

One particular problem related to the formation of copper interconnect features such as copper filled vias and trenches is the practice of forming a conformal barrier/adhesion layer within the anisotropically etched features prior to filling with copper. The barrier/adhesion layer is typically a refractory metal such as tantalum nitride (TaN) formed to prevent diffusion of copper into the porous insulating dielectric layer (ILD) within which the via and trench openings are formed.

After filling of the interconnect features with copper, for example by electroplating, a CMP process is carried out to first remove the excess copper overlying the barrier/adhesion layer and another CMP process performed to remove the barrier/adhesion layer overlying the insulating (ILD) layer. During a portion of the CMP processes positively and negatively charges species present in the polishing slurry act as an electrolyte in contact with two dissimilar metals, for example tantalum and copper, thereby forming a galvanic cell. Such galvanic action is believed to be at least in part responsible for copper corrosion at the surface of copper filled features that takes place in CMP processes where both the barrier/adhesion layer and copper features are being polished.

Another factor related to corrosion in copper CMP processing is believed to be related to the electrostatic charging that occurs due to the polishing action between the polishing pad and the semiconductor process surface. The buildup of electrostatic charge on the semiconductor wafer surface contributes to anodic corrosion of copper containing features at the semiconductor wafer process surface.

For example, referring to FIG. 1 is shown a portion of a multi-layer structure including dual damascene structures e.g., 10, 12 and 13, 15 forming stacked dual damascene structures. The stacked dual damascene structures include a via portion e.g., 10A,12A and a trench line portion e.g., 10B, 12B, formed in a first insulating dielectric layer (ILD) 14A and a second ILD layer 14B. After patterning and anisotropically etching the via and trench openings in ILD 14A, a barrier/adhesion layer e.g., 16A, is conformally deposited to form a thin layer to line the dual damascene structure prior to filling with copper, e.g., 18A, for example by an electrodeposition process. Following the copper filling process, a CMP process is carried out to polish back excess copper and the underlying barrier/adhesion layer formed over the ILD layer 14A surface (not shown) to planarize the ILD layer 14A prior to forming the overlying ILD layer 14B to form another overlying dual damascene structure, e.g., 12 and 15. During the CMP process, copper corrosion of the upper portion of, for example, trench line e.g., 10B, 12B, may take place by anodic and galvanic corrosion leaving the upper portion of the trench line e.g., 10B, 12B, devoid of copper filling e.g., as shown at e.g., 10C, 12C thereby causing an open circuit in the electrical interconnect.

Therefore, there is a need in the semiconductor art to develop a CMP method and apparatus for planarizing dielectric layers including copper semiconductor features such that the occurrence of CMP induced defects such as copper corrosion is reduced or prevented.

It is therefore an object of the invention to provide a CMP method and apparatus for planarizing dielectric layers including copper semiconductor features such that the occurrence of CMP induced defects such as copper corrosion is reduced or prevented while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method and apparatus for implementing the method for preventing or reducing corrosion of copper containing features included in a semiconductor wafer in a chemical mechanical polishing (CMP) process.

In a first embodiment, the method includes providing at least one semiconductor wafer polishing surface including copper filled anisotropically etched features; polishing the at least one semiconductor wafer polishing surface according to a CMP process having a polishing pad surface contacting the at least one semiconductor wafer polishing surface at least a portion of the polishing pad in electrically conductive communication with a conductive polishing platen; and, providing at least one electrically conductive pathway from the conductive polishing platen to ground potential during at least a portion of the CMP process to reduce an electrical charge at the at least one semiconductor polishing surface.

In a first embodiment of a CMP apparatus for implementing the method of the present invention the CMP apparatus includes a polishing pad surface for contacting at least one semiconductor wafer polishing surface at least a portion of the polishing pad in electrically conductive communication with a moveable conductive polishing platen; and, at least one electrically conductive pathway in electrical contact with the moveable conductive polishing platen and with a grounding potential means for reducing an electrical charge at the at least one semiconductor polishing surface during at least a portion of the CMP process.

These and other embodiments, aspects and features of the invention will be better understood from a detailed description of the preferred embodiments of the invention which are further described below in conjunction with the accompanying Figures.

BRIEF DESCRIPTION OF THE DRAWINGS

FIGS. 2A–2C shows various views of an exemplary embodiment using a linear CMP apparatus according to the present invention including an exemplary electrical contact member for providing an electrical pathway to ground potential.

FIG. 2D shows a conceptual 3-dimensional view of an exemplary embodiment using a rotary CMP apparatus according to the present invention including an exemplary electrical contact member for providing an electrical pathway to ground potential.

FIG. 3 is a side view representation of a portion of exemplary copper containing semiconductor features in a multi-layer semiconductor device showing the reduction or prevention of copper corrosion following a CMP process according to the present invention.

DETAILED DESCRIPTION OF THE PREFERRED EMBODIMENTS

Although the present invention is explained with respect to exemplary linear and rotary CMP polishers the method and apparatus of the present invention will be understood to be adaptable to any CMP polishing apparatus where an electrical communication pathway extending from a polishing platen to ground potential is provided during a CMP process. Further, implementation of the method and apparatus of present invention while explained with reference to CMP of particular copper containing semiconductor features, it will be understood that the method and apparatus of the present invention may be applied to any copper containing semiconductor feature whereby anodic corrosion of the copper may be advantageously reduced or avoided by implementing the method and apparatus in a semiconductor wafer CMP process. It will be further appreciated that the method and apparatus of the present invention is envisioned to be used several times in the manufacture of a multi-layer semiconductor device and that the particular semiconductor manufacturing processes set forth herein are intended to exemplify the practice of the present invention. It will be also understood that the use of the term 'copper' herein includes copper or alloys thereof.

Figure 2A:
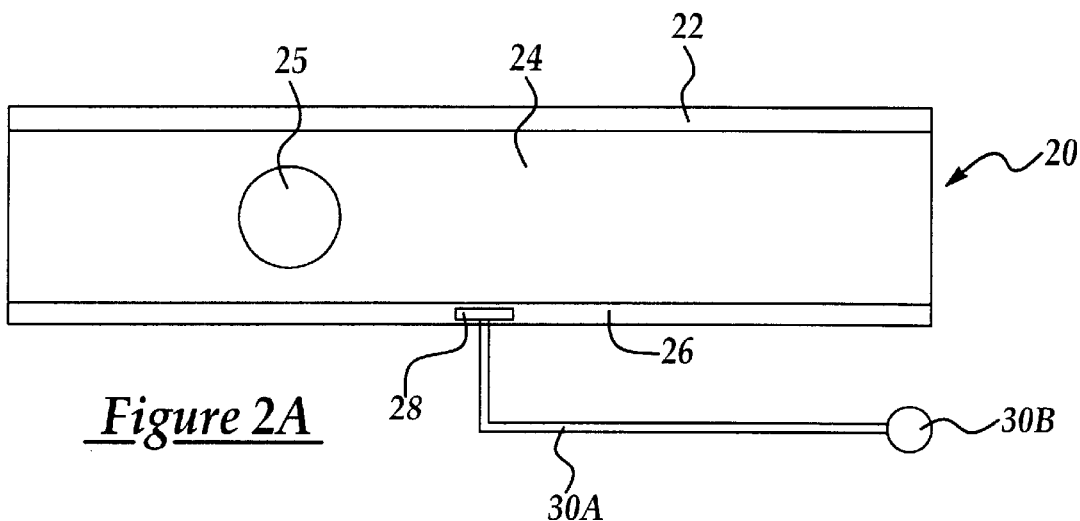

In an exemplary apparatus, for example, referring to FIG. 2A, is shown a portion of a top view of a linear CMP polisher 20 having a metal polishing platen, for example, stainless steel belt 22, and an overlying polishing pad 24, preferably attached with an electrically conductive adhesive to the metal platen belt 22. An exemplary positioning of a semiconductor wafer 25 is shown with a polishing surface in contact with the polishing pad 24. Any polishing pad material may be used as there are a variety of types adapted for particular polishing applications as is known in the art. The electrically conductive adhesive may include any type of electrically conductive adhesive, for example an adhesive containing small particles of metal to increase an electrical conductivity of adhesive of which there are a variety of commercially available products. It will be appreciated that use of the electrically conductive adhesive is a preferable embodiment according to the present invention but is not necessarily required, as long as there is sufficient electrical communication between a portion of the polishing pad, for example, including an edge portion, and the metal polishing platen, for example a stainless steel belt 22 to remove at least a portion of the electrical charge at wafer polishing surface along an electrical communication pathway to ground potential during a CMP process as further explained below.

According to the present invention, an electrical communication pathway to ground potential is provided from the metal polishing platen during a CMP process. As is known in the art, a CMP process generally includes placing a polishing surface of the semiconductor process wafer in contact against a flat polishing surface, imparting a downforce to the wafer backside and moving the wafer and the polishing surface relative to one another. The polishing action is typically aided by a slurry which includes for example, small abrasive particles such as silica ($SiO_2$) or alumina ($Al_2O_3$) that abrasively act to remove a portion of the process surface. Additionally, the slurry may include chemicals such as complexing agents, film forming agents that react with the process surface to assist in removing a portion of the surface material, the slurry typically being introduced to contact the wafer surface and the polishing pad. In addition, copper corrosion inhibitors may be applied to contact the polishing surface.

Referring to FIG. 2A, in an exemplary embodiment, the electrical communication pathway is provided from an exposed peripheral portion of the metal polishing platen providing electrically conductive communication, for example, exposed portion e.g., 26 of stainless steel belt 22, to ground potential e.g., 30B. The electrical communication pathway preferably includes means to maintain continuous contact with an exposed peripheral portion the polishing platen during a CMP process.

In one embodiment, the electrical pathway to ground potential including means to maintain continuous contact with an exposed peripheral portion the polishing platen includes an electrical contact member, for example, rotatable metal member 28 to conductively contact the exposed peripheral portion the polishing platen, for example, exposed portion 26 the stainless steel belt 22. The rotatable metal member 28 may optionally include metal bearings (not shown) to reduce friction as the rotatable member 28 is preferably stationary with respect to the moving stainless steel belt 22 during the CMP process. The rotatable member 28 preferably provides a continuous electrical pathway from exposed portion 26 of the stainless steel belt 22 through the rotatable metal member 28 to ground potential area 30B. The ground potential area 30B may be any convenient pathway to ground potential. Electrical communication from the rotatable metal member 28 to ground potential area 30B is provided by a conventional conductive pathway member 30A, for example including one or more conductive wires, cables, or rods, or combinations thereof. The rotatable metal member, metal bearings, and conductive pathway member may include any conductive metal including, for example, stainless steel.

Figure 2B:
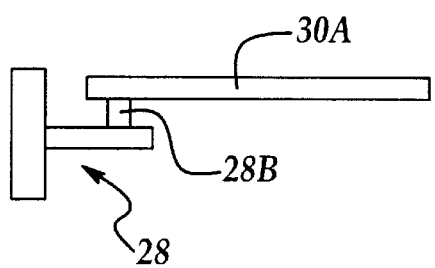

Referring to FIG. 2B, is shown an expanded side view of a portion of an exemplary rotatable metal member 28. The rotatable member 28 preferably includes means to maintain continuous contact with an exposed peripheral portion the polishing platen during a CMP process. For example, an electrically conductive spring force member 28B, the spring force adjustably arranged to provide a downforce in response to upward or downward motion of the rotatable member 28, for example, to maintain continuous with a conductive polishing plat. For example, the spring force member in an exemplary embodiment is disposed between a portion of the conductive pathway member 30A and the rotatable member 28 to continually apply a force, for example a downward force, to allow the rotatable member 28 to maintain contact with an exposed portion of the stainless steel belt 26 as the steel belt moves during a CMP process. For example, in operation, the rotatable member 28 in contact with the stainless steel belt rotates in response to linear motion of the stainless steel belt while remaining substantially linearly stationary with respect to the linear motion of the stainless steel belt during the CMP process. It will be appreciated that other means to maintain continuous contact with an exposed peripheral portion the polishing platen may be used, for example, such as a hinged arm connecting the rotatable member 28 to the conductive pathway member 30A to maintain continuous electrically conductive contact with the stainless steel belt 22 during the CMP process by means of gravity force.

Alternatively, referring to FIG. 2C, means to maintain continuous electrically conductive contact with an exposed peripheral portion the polishing platen may include a slotted metal member 32 with a plurality of metal rotatable members e.g., 34A, 34B, 34C, 34D, 34E, for example, disposed above and below an adjustable width slotted area e.g., 32A. For example, the stainless steel belt 26 or other electrically conductive polishing platen may have an exposed peripheral portion fitted snugly within adjustable width slotted area 32A, to form electrically conductive contact with the polishing platen through the plurality of metal rotatable members and preferably to maintain continuous conductive contact during a CMP process.

In another embodiment, referring to FIG. 2D is a representative 3-Dimensional view of a portion of a rotary CMP apparatus 36 showing semiconductor wafers e.g., 38 A, 38B, 38C, having a polishing surfaces in contact with polishing pad 36B preferably adhesively attached to electrically conductive polishing platen 36C. The adhesive may optionally be electrically conductive. As in previous embodiments, an electrically conductive pathway to ground potential is provided between the polishing pad 36B, conductive polishing platen 36C, for example, stainless steel, and ground potential area, e.g., 40. Preferably, an electrical contact member for electrically contacting an exposed portion of the polishing pad is provided to form an electrical pathway to ground potential during a CMP process. Preferably, the electrical contact member includes means to maintain continuous electrically conductive contact with an exposed peripheral portion the polishing platen during a CMP process. For example, metal rotatable member 38, for example, including bearings (not shown), is provided including a spring force member 38B to maintain a continuous electrical communication pathway from the polishing platen 36C to ground potential area 40 via electrical pathway member 38C, similar to the embodiment in FIG. 2A. It will be appreciated that the electrical contact member may, for example, make electrical contact with an exposed peripheral portion of the polishing platen including a polishing pad attachment surface, a circumferential surface, or a backside surface of the polishing platen. For example, as shown in FIG. 2D the rotatable member 38 makes rotary electrically conductive contact with a circumferential surface e.g., 36D of the conductive polishing platen 36C. Preferably, in operation, the electrical contact member, e.g., metal rotary member 38 is substantially stationary with respect to the rotary motion of the polishing platen, but preferably includes rotation of metal rotary member 38 rotary response to rotary motion of the polishing platen to reduce a contact friction therebetween during a CMP process.

In the method of implementing the present invention of providing an electrical communication pathway from a polishing platen to ground potential during a CMP process, the electrical communication pathway is preferably formed proximal to the semiconductor wafers during the CMP process. By the term 'proximal' is meant less than about 5 diameters of a process wafer. For example, proximal location of the electrical communication pathway reduces the likelihood of localized electrostatic charging. Preferably, electrical communication to ground potential is provided simultaneously with a CMP process, however, it will be appreciated that electrical communication to ground potential may be advantageously applied during only a portion of the CMP process, for example, after removing a major portion of an excess copper layer from the wafer polishing surface following an electrodeposition process. Preferably, the electrical communication pathway to ground potential is at least applied prior to a copper overpolishing process where an underlying barrier/adhesion layer is at least partially polished.

In an exemplary implementation of the present invention, recess formation due to anodic corrosion of copper in, for example, copper-filled dual damascene structures was reduced from about 3000 to 4000 Angstroms during a CMP process to less than about 1000 Angstroms when providing an electrical pathway to ground during a CMP process according to the present invention.

Figure 1:
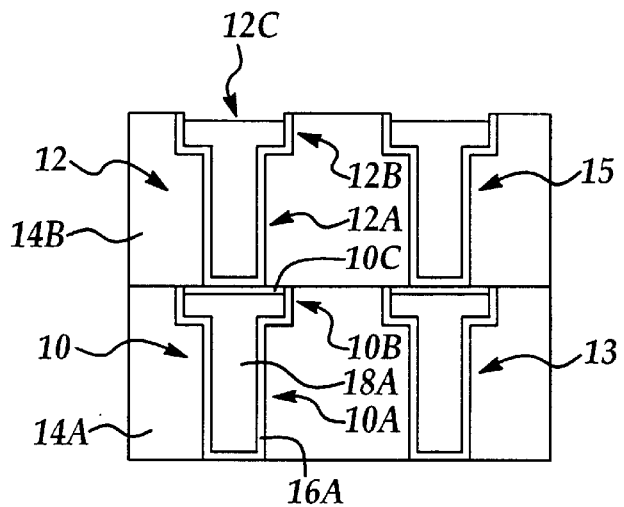
FIG. 1 is a side view representation of a portion of exemplary copper containing semiconductor features in a multi-layer semiconductor device showing the effect of copper corrosion following CMP processes according to the prior art.

For example referring to FIG. 3 is shown a conceptual side view of a portion of stacked dual damascene structures 301A, 301B, 301C, 301D similar to FIG. 1. The dual damascene structures are formed in inter-layer dielectric (ILD) layers 302A and 302B and are filled with copper, e.g., 304A, 304B over a barrier adhesion layer e.g., 302A, 302B. In FIG. 3, however, an electrical pathway to ground potential according to an embodiment of the present invention was provided during a CMP process to reduce an electrical charge at the wafer polishing surface thereby reducing anodic corrosion forming recessed area e.g., 306A, 306B, to less than about 1000 Angstroms. It has been found that acceptable semiconductor device performance may be achieved with copper recessed areas, e.g., 306A, 306B, of less than about 1000 Angstroms.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for preventing or reducing corrosion of copper containing features included in a semiconductor wafer in a chemical mechanical polishing (CMP) process comprising the steps of:

providing at least one semiconductor wafer polishing surface including copper filled features;

polishing the at least one semiconductor wafer polishing surface according to a CMP process having a polishing pad surface contacting the at least one semiconductor wafer polishing surface at least a portion of the polishing pad in electrically conductive communication with a conductive polishing platen; and, providing at least one electrically conductive pathway comprising an electrical contact member for maintaining continuous contact with a portion of the conductive polishing platen to maintain continuous electrical communication from the semiconductor wafer polishing surface to ground potential during the CMP process to reduce an electrical charge at the at least one semiconductor wafer polishing surface.

2. The method of claim 1, wherein the at least a portion of the polishing pad is attached to the conductive polishing platen by an electrically conductive adhesive.

3. The method of claim 1, wherein the electrical contact member is positioned to provide electrically conductive contact with a peripheral portion of the conductive polishing platen.

4. The method of claim 1, wherein the electrical contact member is maintained linearly stationary with respect to a motion of the conductive polishing platen during the CMP process.

5. The method of claim 4, wherein a contact friction between the electrical contact member and the conductive polishing platen is minimized by rotary motion of the electrical contact member in response to the motion of the conductive polishing platen.

6. The method of claim 1, wherein the at least a portion of the CMP process includes at least partially polishing a barrier/adhesion layer underlying a copper layer at the at A least one semiconductor wafer polishing surface.

7. The method of claim 1, wherein the step of providing at least one electrically conductive pathway from the conductive polishing platen to ground potential includes providing the at least one electrically conductive pathway proximal to the at least one semiconductor wafer polishing surface.

8. The method of claim 1, wherein the step of providing at least one electrically conductive pathway includes reducing an electrically conductive pathway resistance to ground potential to remove a substantial portion of an electrical charge at the at least one semiconductor wafer polishing surface.

9. The method of claim 1, wherein the conductive polishing platen moves in at least one of a rotary and linear motion with respect to the semiconductor wafer polishing surface during the CMP process.

10. The method of claim 9, wherein the conductive polishing platen comprises one of a linear and rotary chemical mechanical polisher.

11. The method of claim 1, wherein the electrical contact member comprises at least one rotary means maintained in continuous contact according to an applied force.

12. The method of claim 1, wherein the electrical charge comprises electrostatic charge.

13. The method of claim 1, wherein the step of providing at least one electrically conductive pathway comprises reducing anodic corrosion of the copper filled features.

14. The method of claim 1, wherein the copper filled features are dual damascene features.

* * * * *